(12) United States Patent
Rudduck

(10) Patent No.: US 9,253,931 B2
(45) Date of Patent: Feb. 2, 2016

(54) COMPUTER ROOM SECURITY

(75) Inventor: Dickory Rudduck, Chicago, IL (US)

(73) Assignee: Telezygology, Inc., Chicago, IL (US)

( * ) Notice: Subject to any disclaimer, the term of this patent is extended or adjusted under 35 U.S.C. 154(b) by 219 days.

(21) Appl. No.: 12/935,712

(22) PCT Filed: Mar. 31, 2009

(86) PCT No.: PCT/US2009/038882
§ 371 (c)(1),
(2), (4) Date: Sep. 30, 2010

(87) PCT Pub. No.: WO2009/124007
PCT Pub. Date: Oct. 8, 2009

(65) Prior Publication Data
US 2011/0025502 A1   Feb. 3, 2011

Related U.S. Application Data

(60) Provisional application No. 61/040,898, filed on Mar. 31, 2008.

(51) Int. Cl.
*G08B 21/00* (2006.01)
*H05K 7/20* (2006.01)
*G06F 1/20* (2006.01)

(52) U.S. Cl.
CPC .............. *H05K 7/20836* (2013.01); *G06F 1/20* (2013.01)

(58) Field of Classification Search
CPC .............................. H05K 7/20836; G06F 1/20
USPC ........ 340/5.2, 5.6, 545.6, 687, 540, 584, 604, 340/691.1; 361/688, 724; 700/90
See application file for complete search history.

(56) References Cited

U.S. PATENT DOCUMENTS

| | | | | |
|---|---|---|---|---|
| 5,684,671 | A * | 11/1997 | Hobbs et al. | 361/724 |
| 6,934,786 | B2 * | 8/2005 | Irving et al. | 710/300 |
| 7,086,603 | B2 * | 8/2006 | Bash et al. | 236/51 |
| 7,564,362 | B2 * | 7/2009 | Cole et al. | 340/573.1 |
| 2009/0160211 | A1 * | 6/2009 | Krishnan et al. | 340/5.64 |

FOREIGN PATENT DOCUMENTS

| | | |
|---|---|---|
| WO | WO 2004/001235 | 12/2003 |
| WO | WO 2005/047714 | 5/2005 |
| WO | WO 2005/090798 | 9/2005 |
| WO | WO 2006/105585 | 10/2006 |
| WO | WO 2007/068035 | 6/2007 |

* cited by examiner

*Primary Examiner* — Thomas Mullen
(74) *Attorney, Agent, or Firm* — Heather A. Kartsounes

(57) ABSTRACT

This invention relates to a fastener system, in particular a system for improving computer room security that reduces energy consumption. The fastener system comprises a fastener for fastening a first element to a second element and a sensor of any suitable form and means for activating a third element in response to a signal generated from said sensor. The sensor sends a signal that prompts the third element to act in response to the status received from the fastener. This invention is particularly useful within server racks.

5 Claims, 12 Drawing Sheets

COMPUTER ROOM SECURITY

CROSS-REFERENCE TO RELATED APPLICATIONS

This application is a U.S. National Stage filing based off of PCT/US09/38882 filed on Mar. 31, 2009 claiming priority from U.S. Provisional Application No. 61/040,898 filed on Mar. 31, 2008.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISC APPENDIX

Not applicable.

BACKGROUND OF THE INVENTION

This invention relates to fasteners and in particular to their use in connection with increasing security and/or reducing energy consumption.

There are many circumstances where it is desirable to provide an increased level of security. Examples are encountered on a daily basis in domestic situations, commercial environments, in transport, and so on. At the same time, there is worldwide concern about energy consumption and preservation of energy resources.

By way of example, in data centers within the computer industry there is a desire for security and concern about unnecessary energy consumption. A computer room may contain one or several racks for computer hardware. Many of these generate a significant quantity of heat and to maintain a suitable environment it is necessary to provide cooling. Heat increases may occur locally in a single rack, yet often the whole computer room is cooled—an unnecessary use of energy.

Lights are required by service personnel when checking, maintaining or servicing computer equipment. Often the only option is to illuminate the whole computer room, when illumination is required only in a small area, such as in or near the piece of equipment or rack being serviced.

Housings for computer hardware are typically locked. Server personnel need keys to gain access. Keys can be mislaid or forgotten, causing access problems.

When servicing has been completed, the unlocked housing should be locked, but occasionally service personnel forget to do this, resulting in a security breach.

It is an object of the present invention, at least in some embodiments, to overcome or alleviate some of these problems and to offer benefits in increased security and/or reduced energy consumption.

BRIEF SUMMARY OF THE INVENTION

Accordingly, in a first aspect, this invention provides a fastener system including at least one fastener for fastening a first element to a second element, a sensor and means for activating a third element in response to a signal generated from the sensor.

The fastener may be any suitable fastener, including a fastener selected from the following patent specifications, each of which is incorporated herein by reference: WO 2005/047714, WO 2004/001235, WO 2005/090798, WO 2006/105585 and WO 2007/068035. Especially preferred are the fasteners disclosed in the above specifications and referred to as beam or radial fasteners.

The fastener will preferably have a fastener body and fastener base. It is appreciated that that the fastener may be used in a variety of forms, such as a discrete fastener or a strip fastener, or any other form.

One fastener may be used, or a plurality of fasteners, preferably networked. The first element and the second element may be chosen from a very wide range. Examples are a door and a substructure therefor, a hardware rack and panel or housing to which it can be attached, a tile for a floor, wall or ceiling and a substructure to which it can be attached. There are a huge number of applications.

The third element may also be chosen from a large range. In some cases, the third element will be the same as the first or the second element, so that the activation causes fastening or unfastening of the first and second elements. In other cases, the third element will be different. For instance, the third element may be a fan or a light.

The sensor in the system of the invention may be attached to the fastener or it may be located remotely from the fastener. It may be able to communicate with the fastener. The sensor may be any type of suitable sensor, depending on what is to be sensed and what is to be the outcome. Similarly, the signal to be generated may take any suitable form and may be generated by any suitable means.

For example, a sensor may sense ambient temperature and compare this to the temperature sensed by another sensor or to a predetermined value table. A signal may be generated to turn on a fan or a heating or cooling system. As another example, a sensor may sense the presence of excess moisture and communicate with a fastener so that the moisture can be dealt with by increased airflow, rather than damaging the data centre equipment.

A sensor may have more than one function. For example, a sensor may sense both heat and light.

Communication can take place in any suitable way. Communication may be directly to a fastener, or with the third element, or may involve the worldwide web. The activation of the fastener may take place in any suitable way. There are several examples in the specifications incorporated herein by reference, and especially reference to the use of shape memory alloy. It is also within the scope of this invention that the activation is initiated by remote means, such as a hand held tool operating through the use of any suitable form of energy, including microwave, electromagnetic, sonic, infrared, radio frequency and so on. The scope of the invention is not necessarily limited to the use of shape memory alloy. Other material may also be useful, such as shape memory polymers and ferromagnetic shape-memory materials.

The signal may be sent in any suitable way, for example, using electrical wiring, or electromagnetic means such as radio or infrared communication means. Preferably, however, hard wiring is used and also provides a means to deliver power to the fastener. For the sake of convenience, much of the description below focuses on application of the system of the invention to data centres in the computer industry. However, it is to be understood that the invention is not limited to this.

In a data centre, each server rack has several modules, for example, CPU, storage and communications modules, each with its own function. There is a need to maintain a suitable environment, especially with regard to the significant amount of heat generated. There is also a need to preserve the data, requiring security as well as airflow and temperature management.

The system of the invention may be conveniently packaged in the form of a module, which can be inserted in a server rack, and which can efficiently manage airflow and temperature control while at the same time enabling fast maintenance in a secure manner.

In this embodiment, the module packaging the system of the invention contains a fastener for locking a front door of the rack to the rack, a rack door closer release, two side panel locks, a warning beeper (to signal when rack door is closing) a light emitting diode (LED) to indicate closed or open status and a cooling fan, activated by a temperature sensor.

Preferably, there is included an external task light for the rack, activated by opening of the rack door after unlocking, and a hidden override key switch to open the rack door in case of power failure or other mishap.

For this type of application, this invention provides a module for a server rack having a door and capacity for stacking a plurality of computer hardware apparatus, the module including:

at least one fastener for opening or closing the door to the rack;

at least one fan for affecting airflow within the rack;

a sensor for sensing temperature above a chosen limit and generating a signal; and means for activating the fan in response to the signal generated from the sensor.

Preferably, the module includes a light activated by communication to the module or when the door is unfastened, and an audible signal (a warning beeper) to sound when the door is closing. It is further preferred that the fastener may be activated remotely to open or close, for example, by signal from a mobile phone or the Internet or a hand held device.

Also in a data centre, the server racks are normally installed on floor tiles which are raised from a sub floor, to permit cabling to be hidden away under the floor. Wall or ceiling cavities could also be used for this purpose, and the invention applies to them, but for convenience the invention will be discussed in the context of floor tiles.

The space in the cavity could be useful for air circulation, if a tile could be unfastened on demand. In addition, it would be desirable to authorise access to the cable cavity by releasing a chosen sequence or pattern of tiles, so that cables could be laid only in a desired way. It would also be desirable to have lighting available in such a situation to illuminate the cable cavity as required without switching on all the lights in the data centre.

For this type of application, this invention provides a fastener system for a tile adapted to cover a cavity, the system including:

at least one fastener for fastening the tile to a substructure, a sensor for sensing temperature and/or moisture above a chosen limit and generating a signal; and means for releasing the fastener in response to the signal generated from the sensor.

Preferably, the fastener system also includes a light for the cavity, the light being activated by the fastener system when the tile is unfastened. It is further preferred that the fastener may be activated remotely to fasten or unfasten, for example, by signal from a mobile phone or the Internet or a hand held device.

Another embodiment of the fastener system for a server rack includes:

at least one fastener for fastening a first element to a second element, said fastener having a sensor to determine status of fastener a trigger box having an LED panel; and a junction box capable of receiving and relaying access authorization.

Preferably, the fastener will comprise material adapted to contract when activated as discussed above. When the fastener system needs to be accessed a user can use an RFID card or other suitable device for authorization and scan the RFID card on a reader joined to the junction box. This junction box can then receive and interpret the level of a user's authorization and will communicate with the trigger box of this reading. The trigger box comprises an LED panel. This panel has indication buttons that may light up to indicate status of the fastener system. For example when the fastener system is locked (i.e. server door is closed) then the LED panel reads with a red light. If the trigger box receives an authorized signal, then the LED panel may read orange. If the fastener system is unlocked (i.e. server door is open) then the LED panel may read green. One skilled in the art will recognize that the any color scheme may be appropriate so long as a key deciphers what the colors mean and that the above colors are for descriptive purposes only.

Once a user is authorized and the LED panel indicates an orange color, a user may then push the indication button which will signal the trigger box to junction box that the button was pushed. The junction box then signals to the fastener to release and the door to the server rack is opened. The LED panel will now read green in color. When a user is done accessing the server rack, he/she simply shuts the door and the first element and second element of the fastener are now joined. This action sends a signal to the trigger box and the LED panel changes color once again.

This fastener system is able to log both opening and closing events and provide such a log to a user.

The junction box will typically mount to the rear of a rack and will accommodate PCB boards, sometimes more then one identical PCB boards, and also a power supply. The junction box processes signals from authorization cards and sends signals/commands to the fastener or plurality of networked fasteners.

The trigger box can trigger at least one fastener or a plurality of networked fasteners.

Communication may occur between the trigger box, junction box, and fastener wirelessly or through hard wiring or any other acceptable communication means.

BRIEF DESCRIPTION OF THE SEVERAL VIEWS OF THE DRAWINGS

Preferred features of the present invention will now be described with particular reference to the accompanying drawings. However, it is to be understood that the features illustrated in and described with reference to the drawings are not to be construed as limiting on the broad scope of the invention.

In the drawings.

DETAILED DESCRIPTION OF THE INVENTION

Figure 1A:
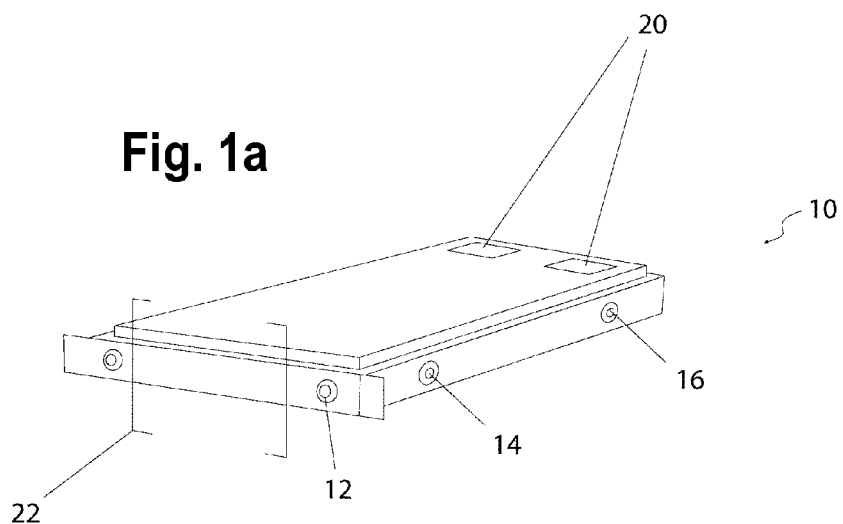
FIG. 1a is a perspective view of an embodiment of the invention, showing a module for a server rack, in front view.
Figure 1B:
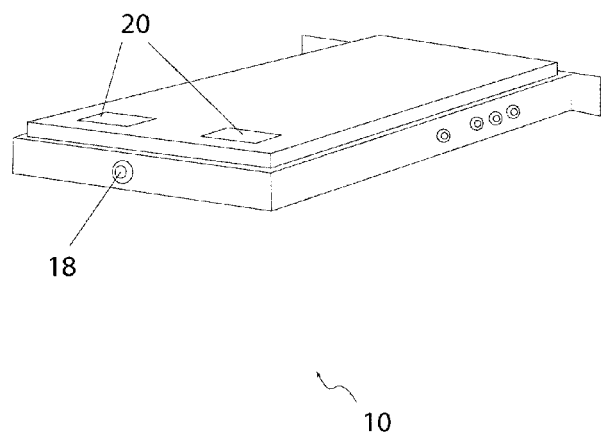
FIG. 1b shows the module of FIG. 1a, in rear view.

Referring first to FIGS. 1a and 1b, module 10 has a fastener body 12 on the front panel, a pair of fastener bodies 14 and 16 on the side panel and a fastener body 18 on the rear panel. Located beneath the top panel is a pair of fans 20 which can circulate air through cutouts provided in the top panel for that purpose.
Inside module 10 is a sensor for sensing temperature above a chosen level and generating a signal to turn fans 20 on and for sensing when temperature has fallen below a chosen level and generating a signal to turn fans 20 off.

Figure 2:
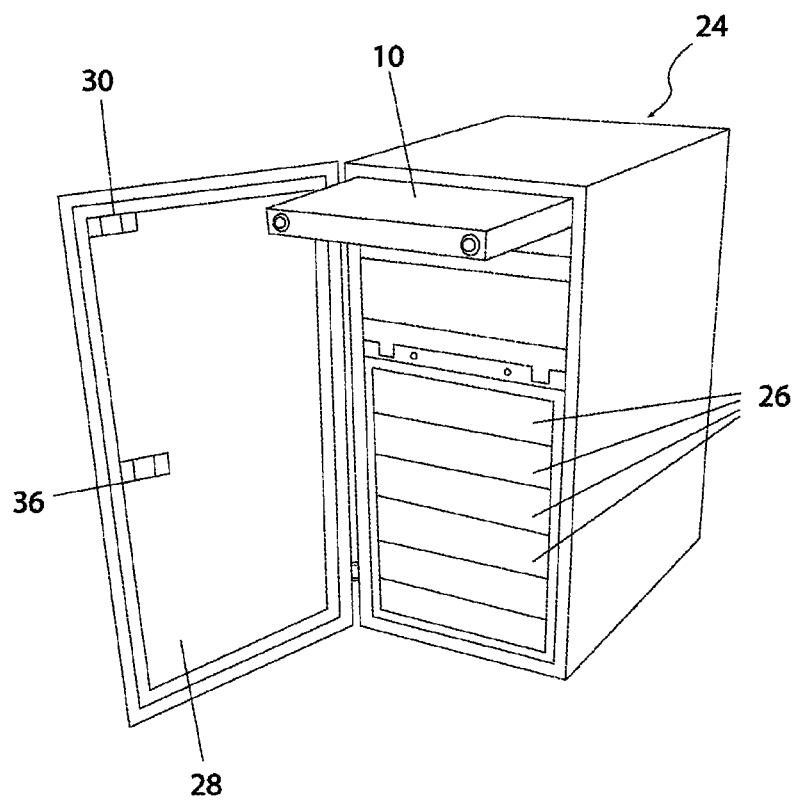
FIG. 2 is a perspective view from the front of a server rack having a door (open) and containing a number of hardware apparatus with a module of the invention partially inserted.
Figure 3:
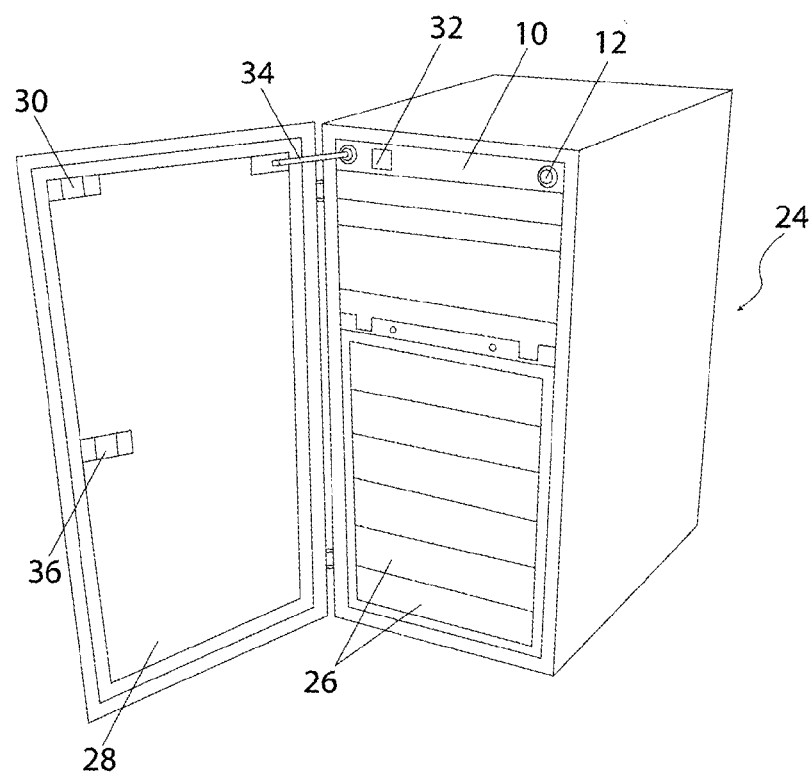
FIG. 3 is a perspective view corresponding to that in FIG. 2, but showing the module fully inserted in the rack.

On the front panel is a LED 22, which gives a status display for module 10. As may be seen from FIGS. 2 and 3, module 10 is designed to fit into server rack 24, along with hardware components (CPU, storage, etc) 26, which are stacked in rack 24 under module 10.

Rack 24 has door 28 which includes a fastener pin in region 30 for insertion in fastener body 12. The fastener pin and fastener body 12 are of the radial fastener type. When fastener body 12 releases the fastener pin and door 28 is opened, button 32 is also released and causes a light (not shown) to be activated, to provide illumination for service of hardware components 26.

Door 28 can be closed by pushing door 28 onto rack 24, so that the fastener pin enters fastener body 12. Alternately, door 28 can be closed remotely by activation of closer 34. Thus if door 28 is accidentally left unlocked, the error can be rectified by remote instruction to module 10, by Internet, for example.

Manual release 36 is included on door 28 in case of power failure.

Figure 4:
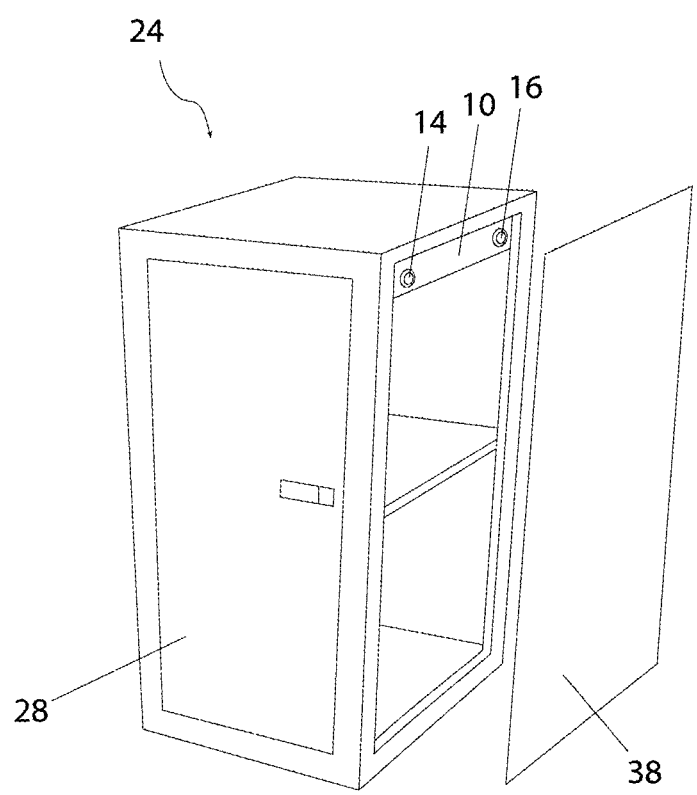
FIG. 4 shows the rack of FIG. 3, with the door closed but a side panel removed.

As shown in FIG. 4, two more fastener bodies 14 and 16 fasten side panel 38 to rack 24, via fastener pins (not shown) on the inside of panel 38; panel 38 can thus be released for access if required.

Figure 5:
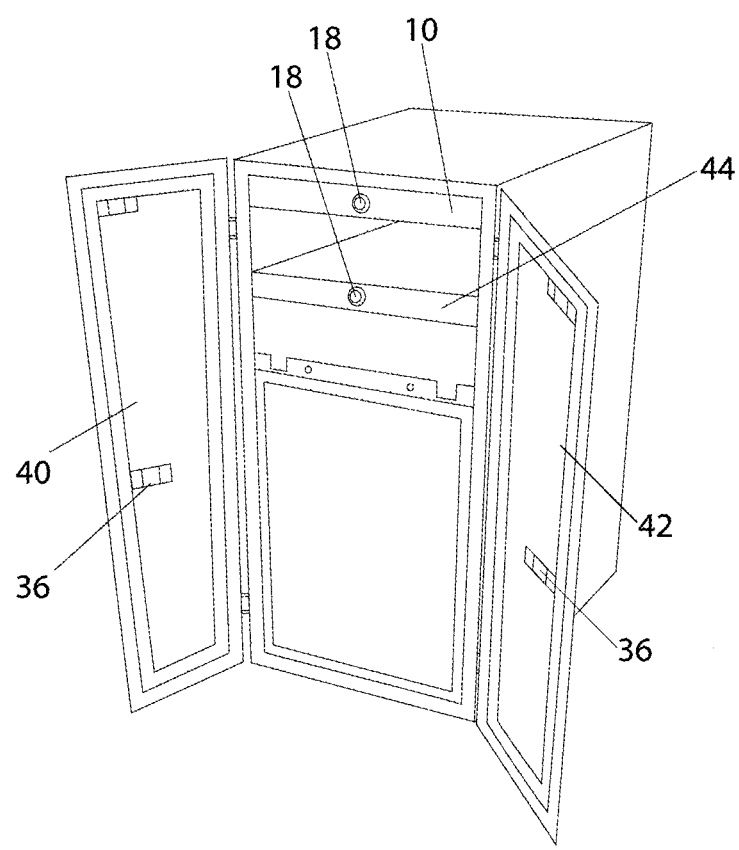
FIG. 5 shows the rear of the rack of FIG. 3.

FIG. 5 shows the rear view of rack 24, showing in this case a second module 44 which, in this case, contains tools for servicing rack 24. Both module 10 and module 44 are locked to doors 40 and 42 by fastener bodies 18, accepting pins (not shown).
Each of doors 40 and 42 has a manual release 36.

Figure 6:
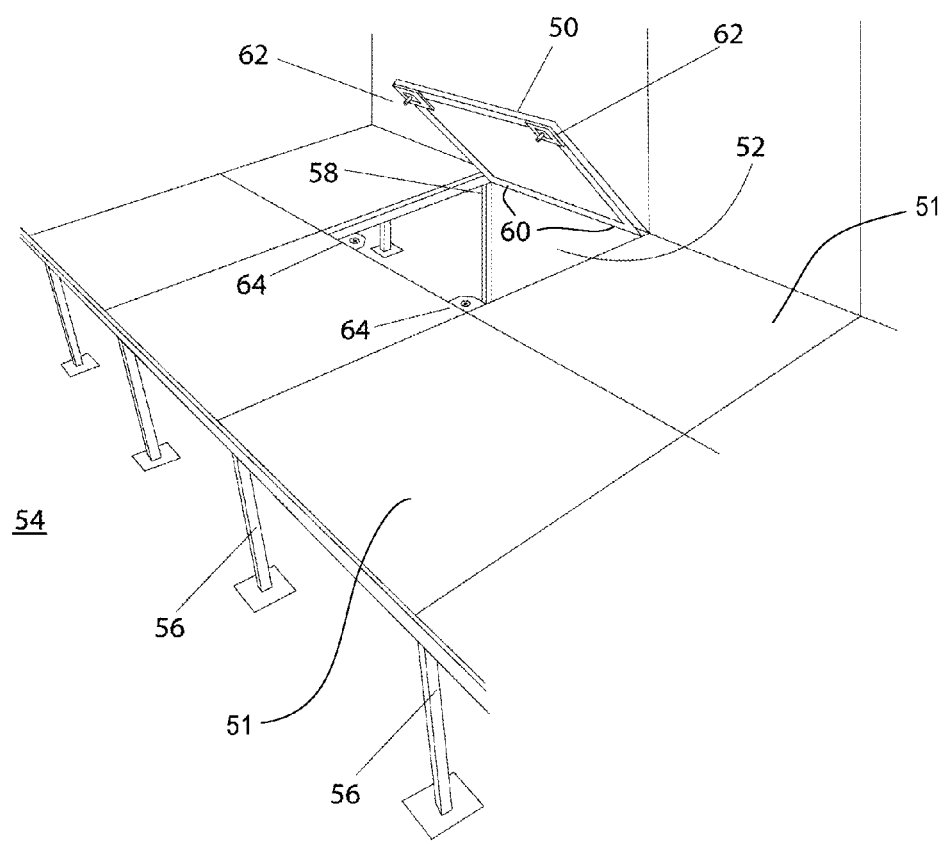
FIG. 6 shows an embodiment of fastener system for a tile, with the tile in the unfastened position.

In FIG. 6, tile 50 is adapted to cover a cavity 52, tile 50 being one of a number of such tiles spaced above floor 54 by supports 56.

Tile 50 is hinged to substructure 58 at 60 and is fastened to substructure 58 when pins 62 are inserted in fastener bodies 64.

Figure 7:
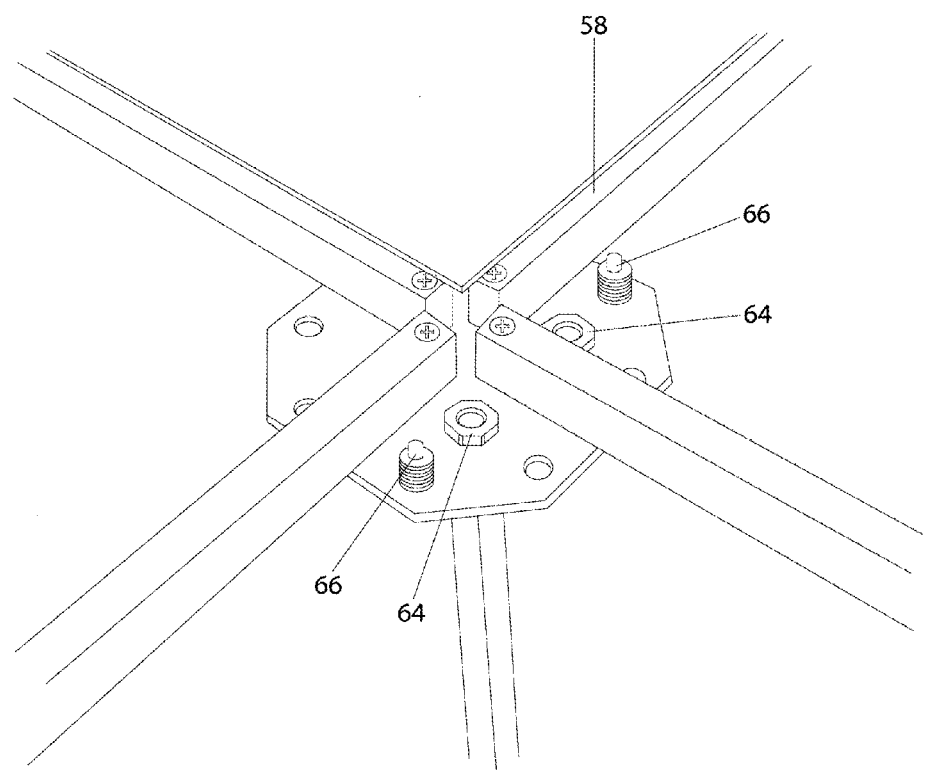
FIG. 7 shows a detail of the substructure for the tile in FIG. 6.

Not shown are temperature and moisture sensing sensors, which sense an undesirably high temperature and/or an undesirably high amount of moisture and generate a signal, causing release of pins 62 from radial fastener bodies 64. Springs 66 (FIG. 7) cause tile 50 to open. At the same time, a light (not shown) is switched on, to illuminate cavity 52.

Tiles 50 may be activated to open by remote signal, generated, for example, by a sensor in a module 10 in FIGS. 1 to 5 (in response to a high temperature in a rack 24, to increase airflow), or by a technician using an authorised tool, or remotely by phone or Internet.

Figure 8:
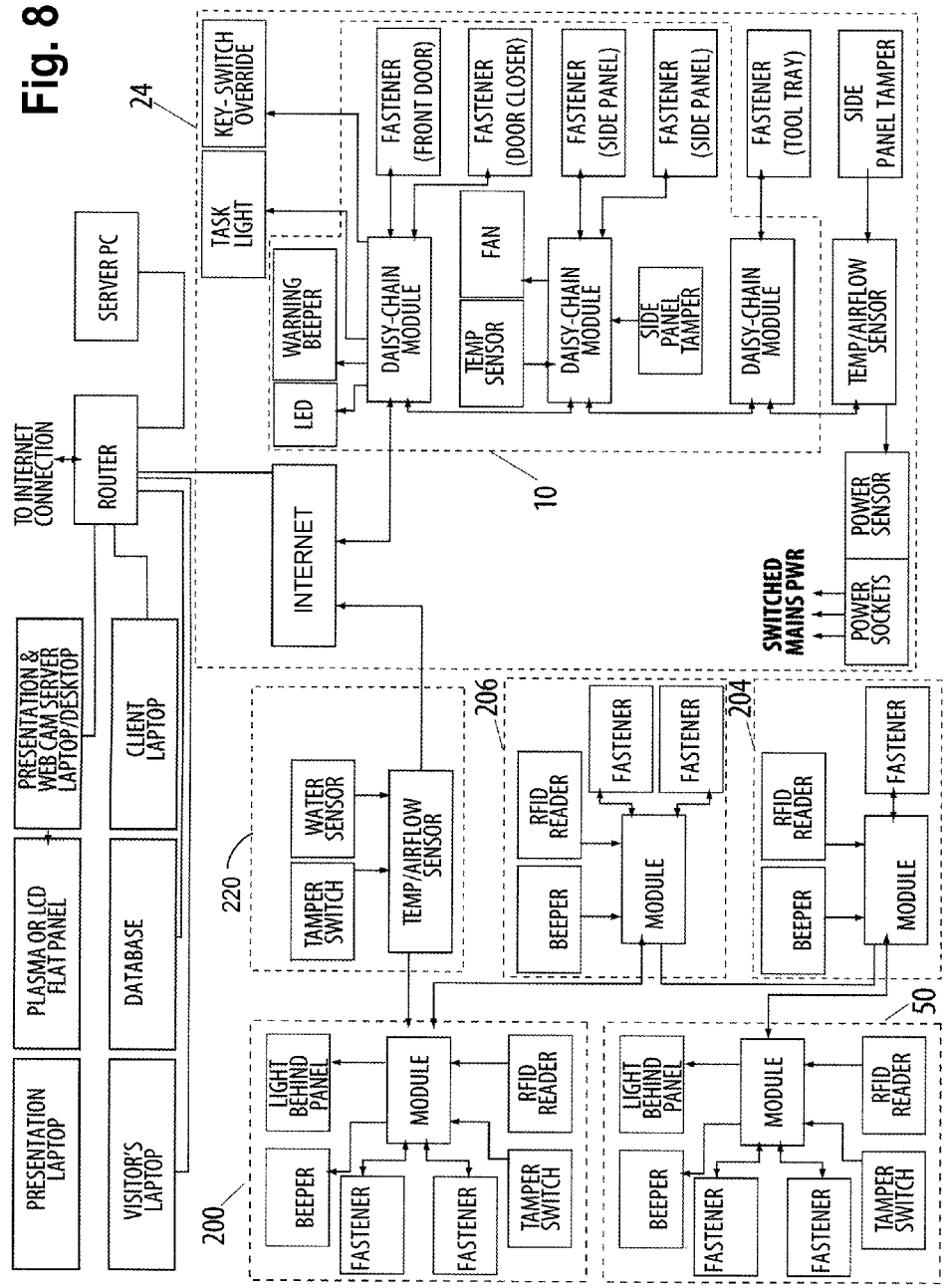
FIG. 8 is a block diagram of a arrangement for the embodiments in the previous Figures.
Figure 9:
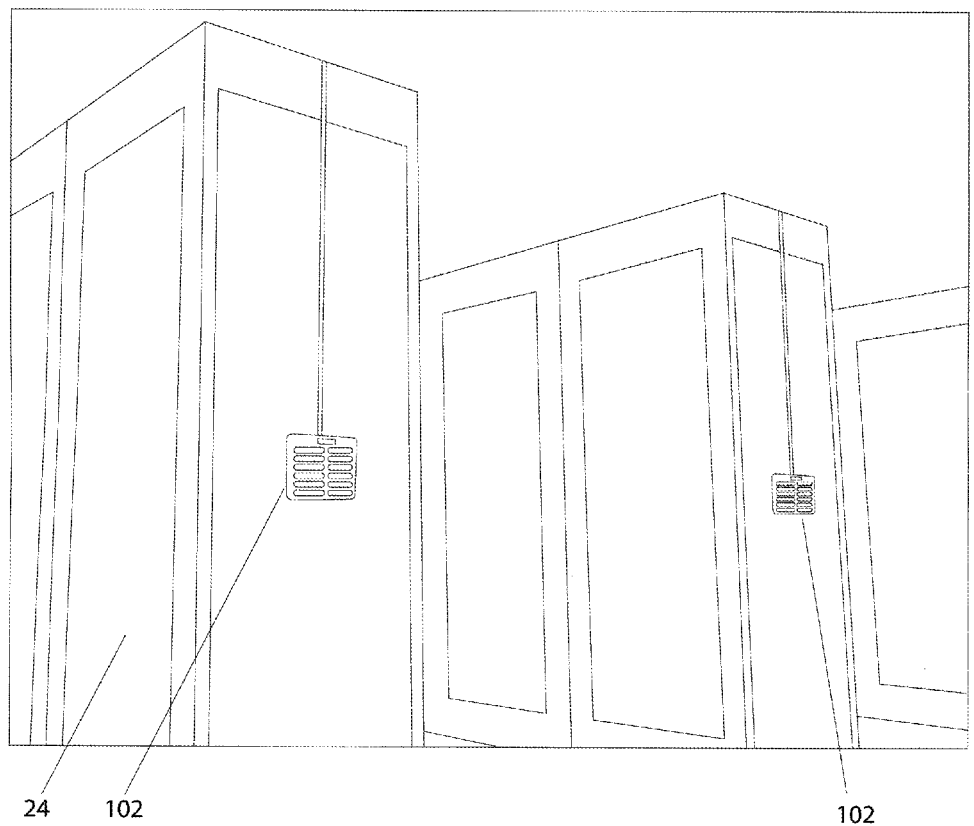
FIG. 9 is a view of the server rack with the trigger box.
Figure 10:
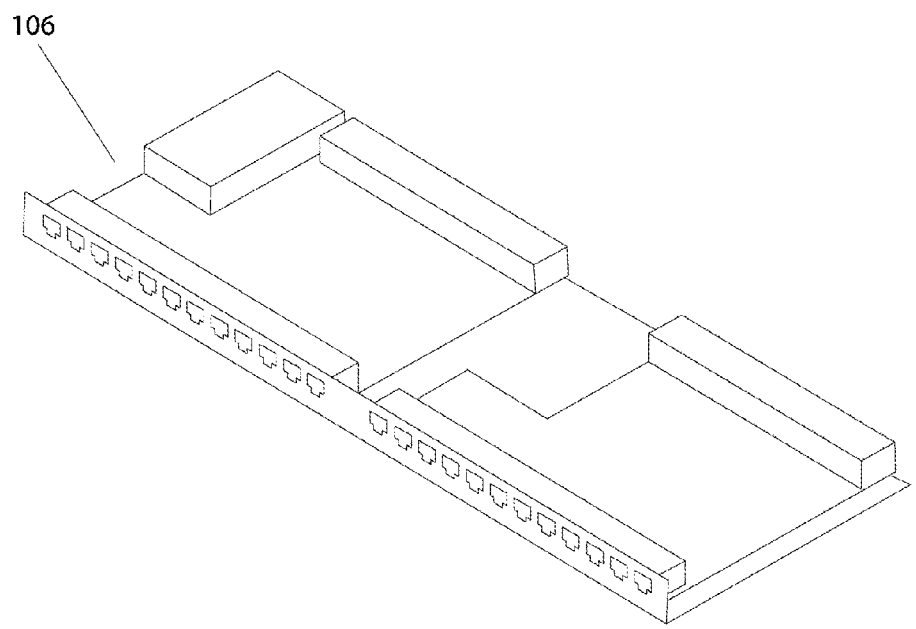
FIG. 10 is a detailed view of the junction box.
Figure 11:
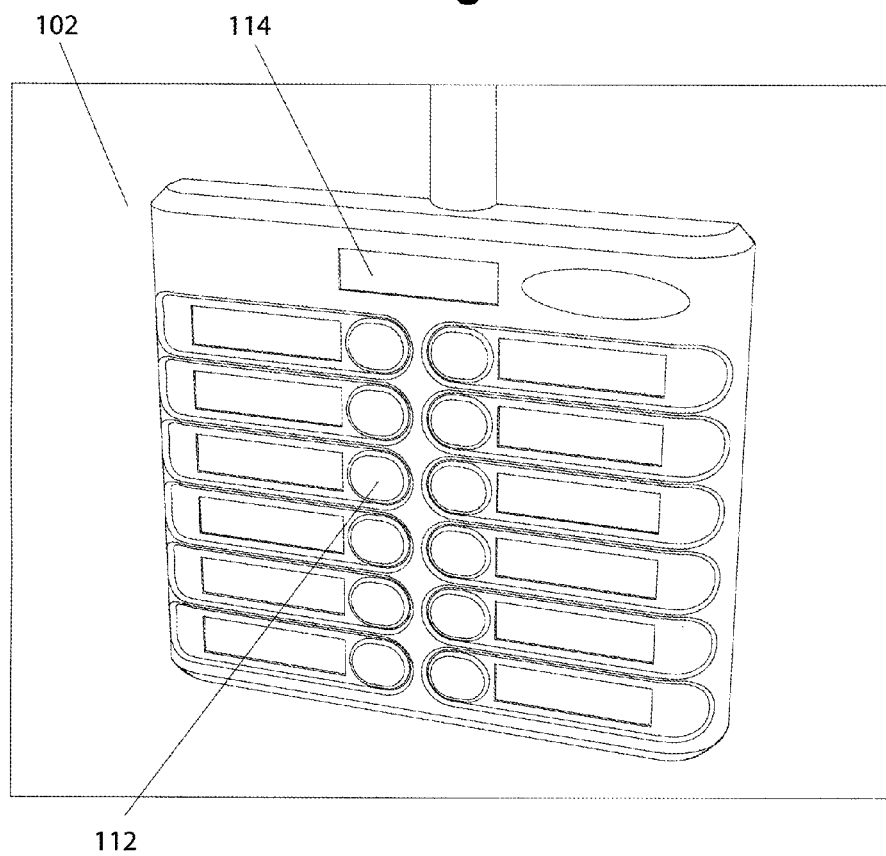
FIG. 11 is a detailed view of the trigger box.

FIG. 8 is a block diagram of a combination of the embodiments in FIGS. 1 to 5 and 6 to 7. This also includes a cable duct 200, an under floor arrangement, a refrigerator door 204 and cabinet/drawer 206 having similar features to those described above. FIG. 8 shows how the various features of the invention can work in different situations.

The "TZ Database Server PC" is a computer hosting the system.

It will be observed that the rack locking tray (module 10 above) connects to a Cloudcom Internet gateway. The daisy chain modules provide network interconnection for the radial fasteners, as well as auxiliary signal interconnection to peripheral devices. The temperature/humidity/air flow sensor 220 is monitored by the Internet via the RPM Client laptop or the TZ client laptop.

It will also be observed that the floor tile (50, above), includes a warning beeper to alert to opening.

Figure 12:
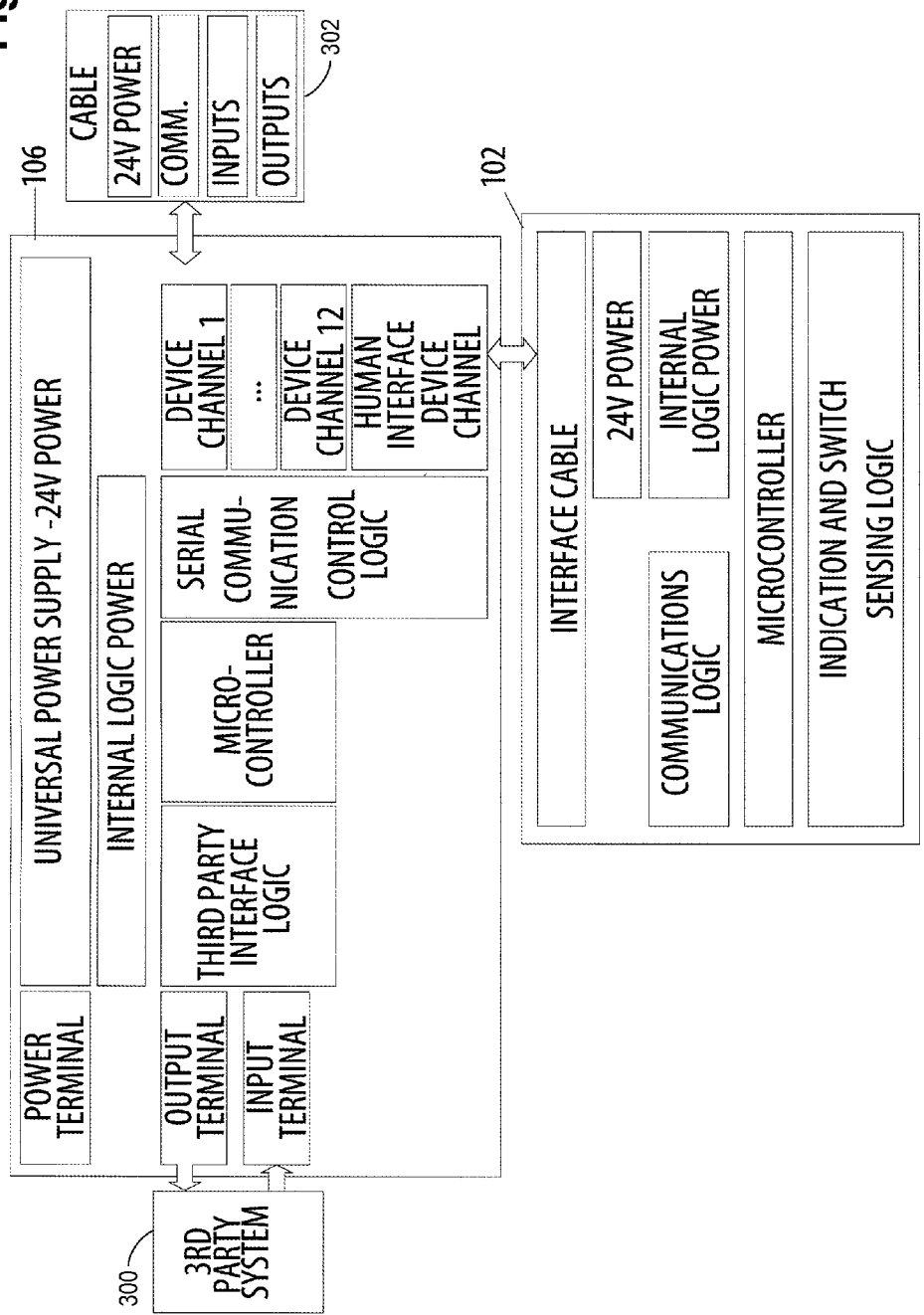
FIG. 12 is a schematic view of the fastener system.

FIGS. 9-12 depicts a fastener system that has a manual component of requesting access to the server rack 24 and also presses a button to release a fastener opening a server rack 24. The trigger box 102 is attached to the rack 24 in an accessible location such as the side of the rack. The junction box system 106 is located in the rear of the rack 24. FIG. 12 depicts the schematic view of the junction box system 106 and trigger box 102. When a user scans for authorization, the junction box system 106 will receive the signal and relay it to the trigger box 102 and the LED panel 114 with indication buttons 112 will be notified. According to the signal received the trigger box 102 the system may allow a user to effectively press an indication button 112 to manually release a fastener within the rack 24. A third party system 300 may be attached to the system as well as cables 302 for connecting periphery devices.

It will be appreciated that the embodiments disclosed herein are not limiting on the scope of the invention and that variations and modifications may be made without departing from the spirit and scope of the invention.

What is claimed is:

1. A removable module for a server rack having a door and sidewalls, the module comprising
    a door fastener for fastening the door to the module;
    a wall fastener for fastening the module to at least one sidewall; and
    a sensor in communication with a fan disposed within the server rack, wherein the sensor is configured to sense environmental conditions and generate a signal to activate at least one of the fan, the door fastener or the wall fastener, and wherein the door fastener includes material adapted to contract when activated for fastening and unfastening the module to the door.

2. The module of claim 1 wherein the door fastener is remotely activatable.

3. The module of claim 1, further including a sensor to determine fastened and unfastened status of the door fastener.

4. The module of claim 1 wherein said sensor is a moisture sensor.

5. The module of claim 1, further including a light activatable when said door is unfastened from the module.

* * * * *